(12) United States Patent
Brown

(10) Patent No.: US 8,083,862 B2
(45) Date of Patent: Dec. 27, 2011

(54) METHOD AND SYSTEM FOR MONITORING CONTAMINATION ON A SUBSTRATE

(75) Inventor: Ian J. Brown, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 324 days.

(21) Appl. No.: 11/684,203

(22) Filed: Mar. 9, 2007

(65) Prior Publication Data

US 2008/0216871 A1  Sep. 11, 2008

(51) Int. Cl.
*B08B 5/00*  (2006.01)

(52) U.S. Cl. ............ 134/30; 134/19; 73/31.03; 438/906

(58) Field of Classification Search ............ 134/19, 134/42, 30; 73/31.03
See application file for complete search history.

(56) References Cited

U.S. PATENT DOCUMENTS

| | | | |
|---|---|---|---|
| 5,261,965 A | | 11/1993 | Moslehi |
| 6,164,133 A | * | 12/2000 | Watanabe ............ 73/432.1 |
| 6,164,295 A | * | 12/2000 | Ui et al. ............ 134/1.1 |
| 6,235,645 B1 | * | 5/2001 | Habuka et al. ............ 438/758 |
| 6,265,717 B1 | * | 7/2001 | Sakata et al. ............ 250/289 |
| 6,528,427 B2 | * | 3/2003 | Chebi et al. ............ 438/694 |
| 6,881,687 B1 | | 4/2005 | Castrucci |
| 6,951,821 B2 | * | 10/2005 | Hamelin et al. ............ 438/706 |
| 7,079,760 B2 | | 7/2006 | Hamelin et al. |
| 2002/0062701 A1 | | 5/2002 | Guldi et al. |
| 2004/0182415 A1 | | 9/2004 | Yoon et al. |
| 2004/0182417 A1 | | 9/2004 | Hamelin et al. |
| 2006/0196527 A1 | * | 9/2006 | Nishimura et al. ............ 134/2 |
| 2008/0102646 A1 | * | 5/2008 | Kawaguchi et al. ............ 438/725 |

OTHER PUBLICATIONS

International Search Report issued in Application No. PCT/US08/055463 mailed Jul. 31, 2008.
Written Opinion issued in Application No. PCT/US08/055463 mailed Jul. 31, 2008.

* cited by examiner

*Primary Examiner* — Michael Kornakov
*Assistant Examiner* — Natasha Campbell

(57) ABSTRACT

A method and system for measuring contamination, such as metal contamination, on a substrate. A dry cleaning system is utilized for non-destructive, occasional removal of contamination, such as metal containing contamination, on a substrate, whereby a monitoring system coupled to the exhaust of the dry cleaning system is employed to determine the relative level of contamination on the substrate prior to dry cleaning.

16 Claims, 10 Drawing Sheets

US 8,083,862 B2

METHOD AND SYSTEM FOR MONITORING CONTAMINATION ON A SUBSTRATE

BACKGROUND OF THE INVENTION

1. Field of Invention

The present invention relates to a method and system for performing a dry cleaning process on a substrate, and more particularly to a method and system for utilizing a dry cleaning process to determine an amount of contamination on the substrate.

2. Description of Related Art

From silicon ingot fabrication through semiconductor device manufacturing, including etching processes, epitaxial or non-epitaxial deposition processes, polishing processes, oxidation processes, implant processes, etc., the semiconductor substrate is exposed to metal contaminants, and these contaminants accumulate throughout the multitude of steps. The evolution of metal contamination on such substrates leads to poor device performance, catastrophic device failure and a subsequent reduction in the yield of usable devices from processed substrates.

As a result, much effort is dedicated to the identification of the sources of metal contamination and the determination of means to reduce the amount of metal contamination exposed to the substrate. Additionally, much effort is devoted to the development of cleaning processes to frequently remove such contamination from contaminated substrates.

SUMMARY OF THE INVENTION

Accordingly, one embodiment is to provide a method and system for performing a dry cleaning process on a substrate.

Another embodiment is to provide a method and system for performing a dry cleaning process in order to determine an amount of contamination on the substrate.

These and/or other embodiments may be provided by a method of monitoring contamination on a substrate. The method includes: disposing the substrate having the contamination in a cleaning system configured to remove the contamination; chemically treating the contamination within the cleaning system in order to chemically alter the contamination; thermally treating the chemically altered contamination in order to evaporate the chemically altered contamination; monitoring the exhaust of gaseous effluent from the thermal treatment of the substrate to determine an amount of contamination on the substrate prior to the disposing the substrate in the cleaning system.

Another method includes: introducing a production substrate to a manufacturing process flow in order to initiate fabrication of an electronic device on the production substrate; during the manufacturing process flow, performing a dry, non-plasma cleaning process on the substrate in order to remove contamination accumulated on the production substrate; and monitoring the exhaust of effluent from the dry, non-plasma cleaning process in order to determine an amount of contamination on the production substrate prior to performing the cleaning process.

Yet another embodiment includes a system for treating a substrate. The system includes: a dry, non-plasma cleaning system having a chemical treatment component configured to chemically alter contamination on the substrate and a thermal treatment component configured to evaporate the chemically altered contamination on the substrate; and an exhaust monitoring system coupled to an exhaust of the dry, non-plasma cleaning system and configured to analyze effluent in the exhaust of the dry, non-plasma cleaning system.

DETAILED DESCRIPTION OF PREFERRED EMBODIMENTS

In the following description, in order to facilitate a thorough understanding of the invention and for purposes of explanation and not limitation, specific details are set forth, such as a particular geometry of the dry cleaning system and descriptions of various components and processes used therein. However, it should be understood that the invention may be practiced in other embodiments that depart from these specific details.

Figure 1:
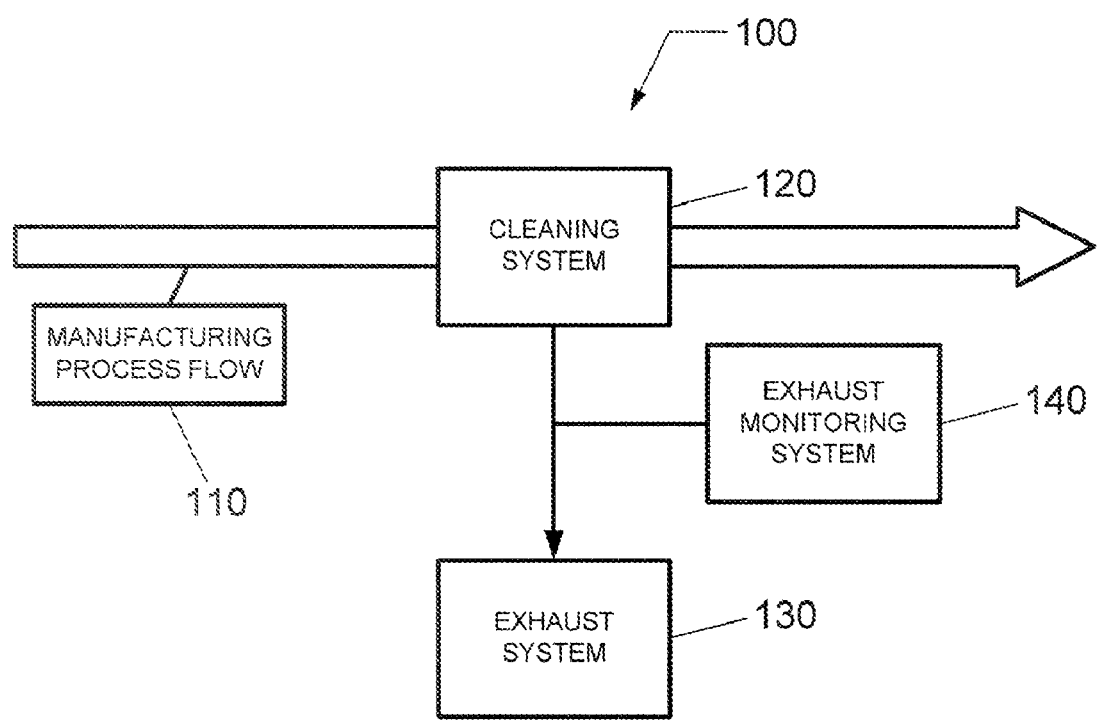
FIG. 1 depicts a method of determining the level of metal contamination in a manufacturing process flow according to an embodiment.

Referring now to the drawings, wherein like reference numerals designate identical or corresponding parts throughout the several views, FIG. 1, illustrates a method 100 of monitoring contamination on a substrate in a manufacturing process flow 110 according to an embodiment. The method 100 comprises inserting a cleaning system 120 within the manufacturing process flow 110, and monitoring the exhaust passing from the cleaning system 120 to an exhaust system 130 using an exhaust monitoring system 140.

Figure 2A:
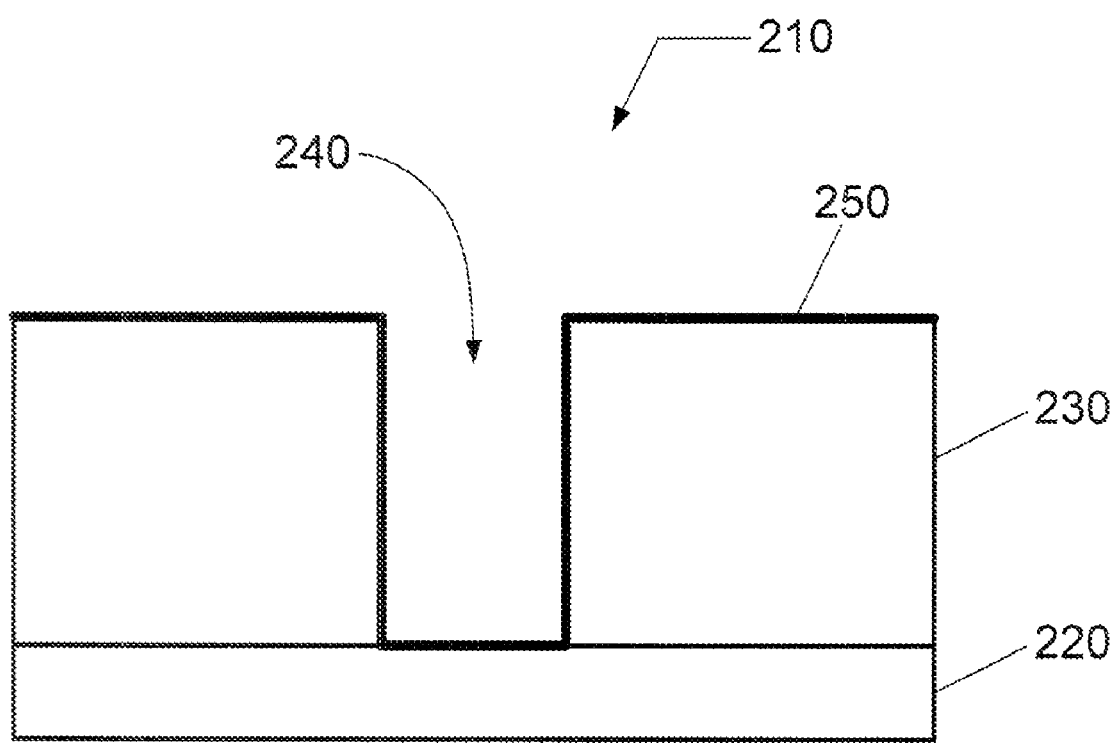
FIGS. 2A through 2C depict an exemplary sequence for dry cleaning a film on a substrate.
Figure 2B:
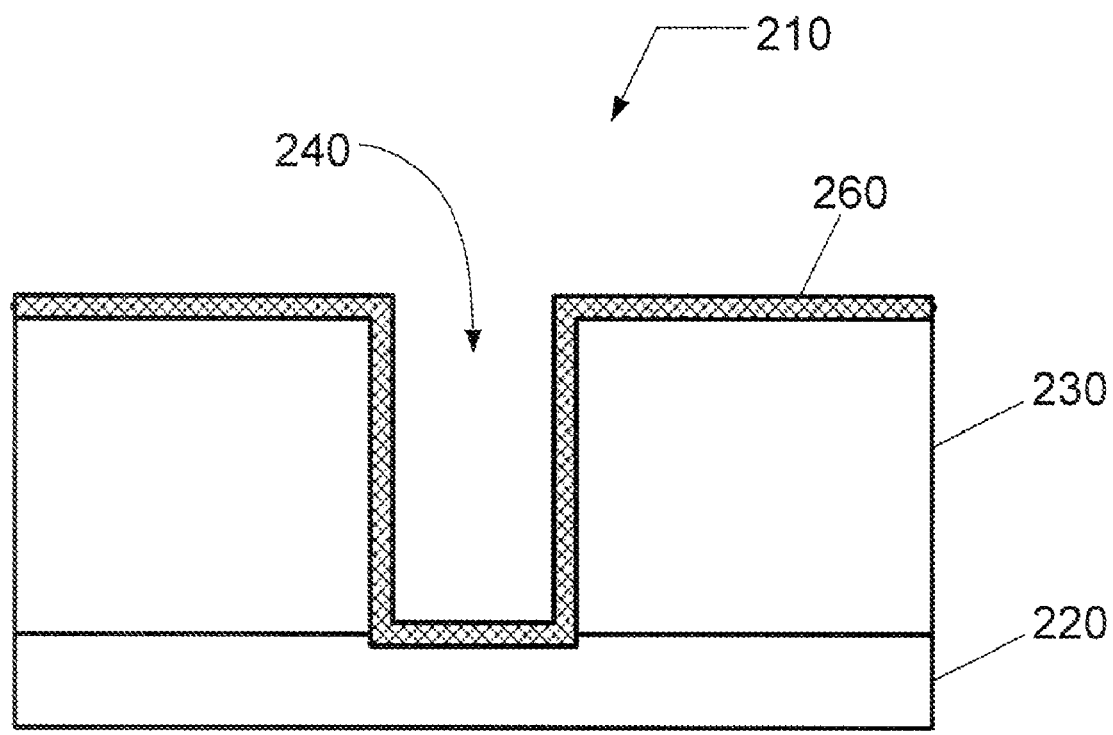
Figure 2C:
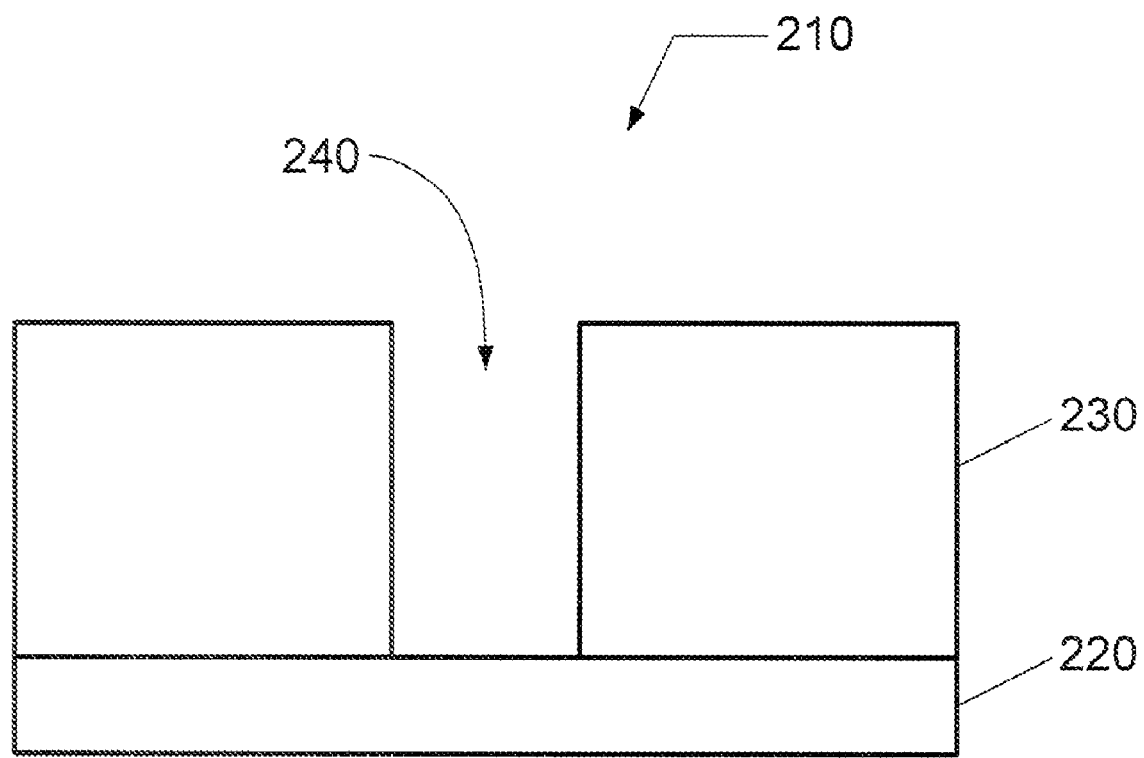
Figure 3:
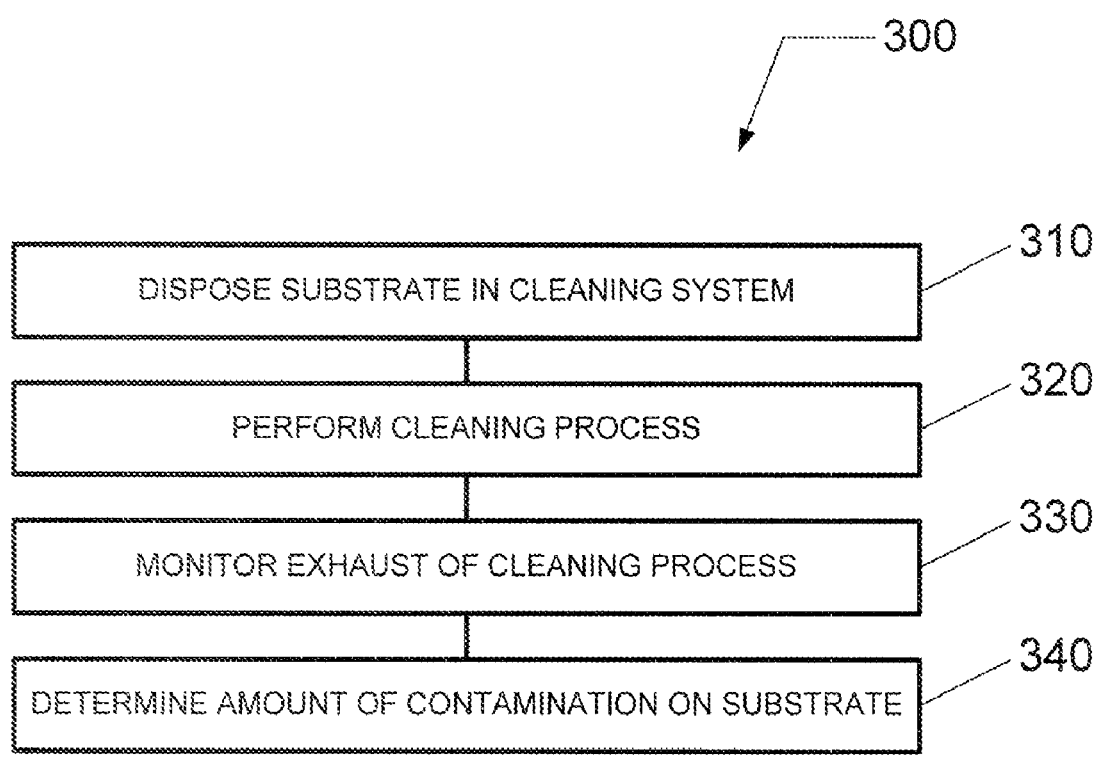
FIG. 3 illustrates a method of processing a substrate according to an embodiment.

The cleaning system can comprise a dry, non-plasma cleaning system configured to chemically treat the contamination on the substrate, followed by desorption of the chemically treated contamination. For example, FIGS. 2A through 2C illustrate a method of cleaning a pattern in a thin film. Additionally, FIG. 3 presents a flow chart 300 of performing the method according to one embodiment.

As shown in FIGS. 2A, 2B, 2C, and 3, an electronic structure 210 is depicted comprising a thin film 230, or series of thin films, formed on an upper surface of a substrate 220 that may or may not include additional layers, wherein a feature 240, or series of features, has been formed therein. The substrate 220 may be a semiconductor, a metallic conductor, or any other substrate to which the thin film is to be formed upon. The thin film, or series of thin films, can include a conductive material, non-conductive material, or a semi-conductor material, or combination thereof. For example, the thin film can include a silicon-containing material such as silicon dioxide, silicon nitride, silicon oxynitride, polycrystalline silicon, single crystal silicon, doped silicon, etc. Additionally, for example, the thin film 230 may comprise a high-k material, or a low dielectric constant (low-k) material.

As illustrated in FIGS. 2A through 2C, the manufacturing of electronic structure 210 can lead to the accumulation of contamination 250, which may be detrimental to the end device. Accordingly, the contamination is removed using a cleaning process as described above and the exhaust of the cleaning process is monitored to assess the level of contamination.

According to an embodiment, the electronic structure 210 and the contamination 250 accumulated thereon are disposed in a cleaning system as in 310 and it is exposed to a dry, non-plasma cleaning process as in 320. The dry non-plasma cleaning process includes a self-limiting feature for removal of the contamination 250 with high selectivity to the underlying layers. Furthermore the substrate comprises a "production substrate" upon which electronic devices are fabricated. The substrate may be a "non-production substrate", such as a blanket substrate or test substrate; however, the method does not require the insertion of non-production substrates into the manufacturing process flow.

The dry, non-plasma cleaning process includes a chemical process during which contamination surfaces of the electronic structure 210, as shown in FIG. 2B, are chemically treated by a process gas comprising HF, or ammonia ($NH_3$), or both HF and $NH_3$, thus forming a chemically altered contamination layer 260. Following the chemical treatment process, a thermal process is performed in order to desorb the chemically altered contamination layer 260, as shown in FIG. 2C. During the thermal process, the temperature of the substrate is raised sufficiently high to permit the volatilization of the chemically altered contamination layer 260. Using the dry, non-plasma cleaning process, the contamination in feature 240 can be substantially removed.

During the chemical treatment process, each constituent of the process gas may be introduced together (i.e., mixed), or separately from one another (i.e., HF introduced independently from $NH_3$). Additionally, the process gas can further include an inert gas, such as a noble gas (i.e., argon). The inert gas may be introduced with either the HF or the $NH_3$, or it may be introduced independently from each of the aforementioned gaseous constituents.

Additionally, during the chemical treatment process, the process pressure may be selected to affect the extent to which contamination layers on the substrate are chemically altered. The process pressure can range from approximately 1 mtorr to approximately 100 torr. Furthermore, during he chemical treatment process, the substrate temperature may be selected to affect the extent to which contamination layers on the substrate are chemically altered. The substrate temperature can range from approximately 10 degrees C. to approximately 200 degrees C.

During the thermal treatment process, the substrate temperature can be elevated above approximately 50 degrees C., or above approximately 100 degrees C. Additionally, an inert gas may be introduced during the thermal treatment of the substrate. The inert gas may include a noble gas or nitrogen.

The chemical treatment process and the thermal treatment process can be performed within the same processing chamber. Alternatively, as will be described in greater detail with regard to FIGS. 4A-6, the chemical treatment process and the thermal treatment process can be performed within separate chambers.

As shown in FIG. 3, in 330, the exhaust from the thermal process is monitored and in 340, the level of contamination is assessed. During the monitoring of the exhaust, the effluent gases may be analyzed to measure the amount of contamination, such as metal contamination. The exhaust monitoring system can, for example, comprise an Inductively Coupled Plasma Mass Spectroscopy (ICP-MS) system coupled to the exhaust line between the cleaning system and the exhaust system. The ICP-MS system can identify the type of impurity and the respective amount of impurity present in the exhaust. For example, the ICP-MS system may include a system commercially available from Varian, Inc. (3120 Hansen Way, Palo Alto, Calif., 94304-1030).

Alternatively, a portion of the gaseous effluent may be condensed upon a sampling member inserted into the exhaust. Thereafter, the collected solid material may be dissolved in a solvent, such as water, and analyzed off-line.

Figure 4A:
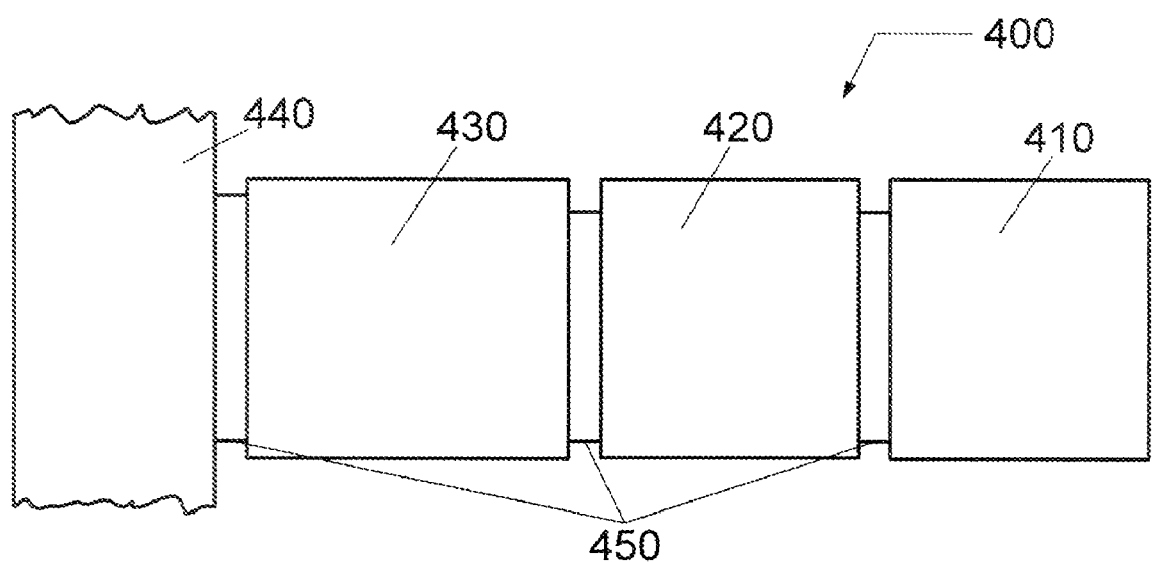
FIGS. 4A through 4C present schematic representations of a treatment system according to another embodiment.

According to one embodiment, FIG. 4A presents a processing system 400 for performing a dry, non-plasma cleaning process on a substrate. The processing system 400 comprises a first treatment system 410, and a second treatment system 420 coupled to the first treatment system 410. For example, the first treatment system 410 can comprise a chemical treatment system (or chemical treatment component), and the second treatment system 420 can comprise a thermal treatment system (or thermal treatment component).

Also, as illustrated in FIG. 4A, a transfer system 430 can be coupled to the first treatment system 410 in order to transfer substrates into and out of the first treatment system 410 and the second treatment system 420, and exchange substrates with a multi-element manufacturing system 440. The first and second treatment systems 410, 420, and the transfer system 430 can, for example, comprise a processing element within the multi-element manufacturing system 440. For example, the multi-element manufacturing system 440 can permit the transfer of substrates to and from processing elements including such devices as etch systems, deposition system, coating systems, patterning systems, metrology systems, etc. In order to isolate the processes occurring in the first and second systems, an isolation assembly 450 can be utilized to couple each system. For instance, the isolation assembly 450 can comprise at least one of a thermal insulation assembly to provide thermal isolation, and a gate valve assembly to provide vacuum isolation. Of course, treatment systems 410 and 420, and transfer system 430 can be placed in any sequence.

Figure 4B:
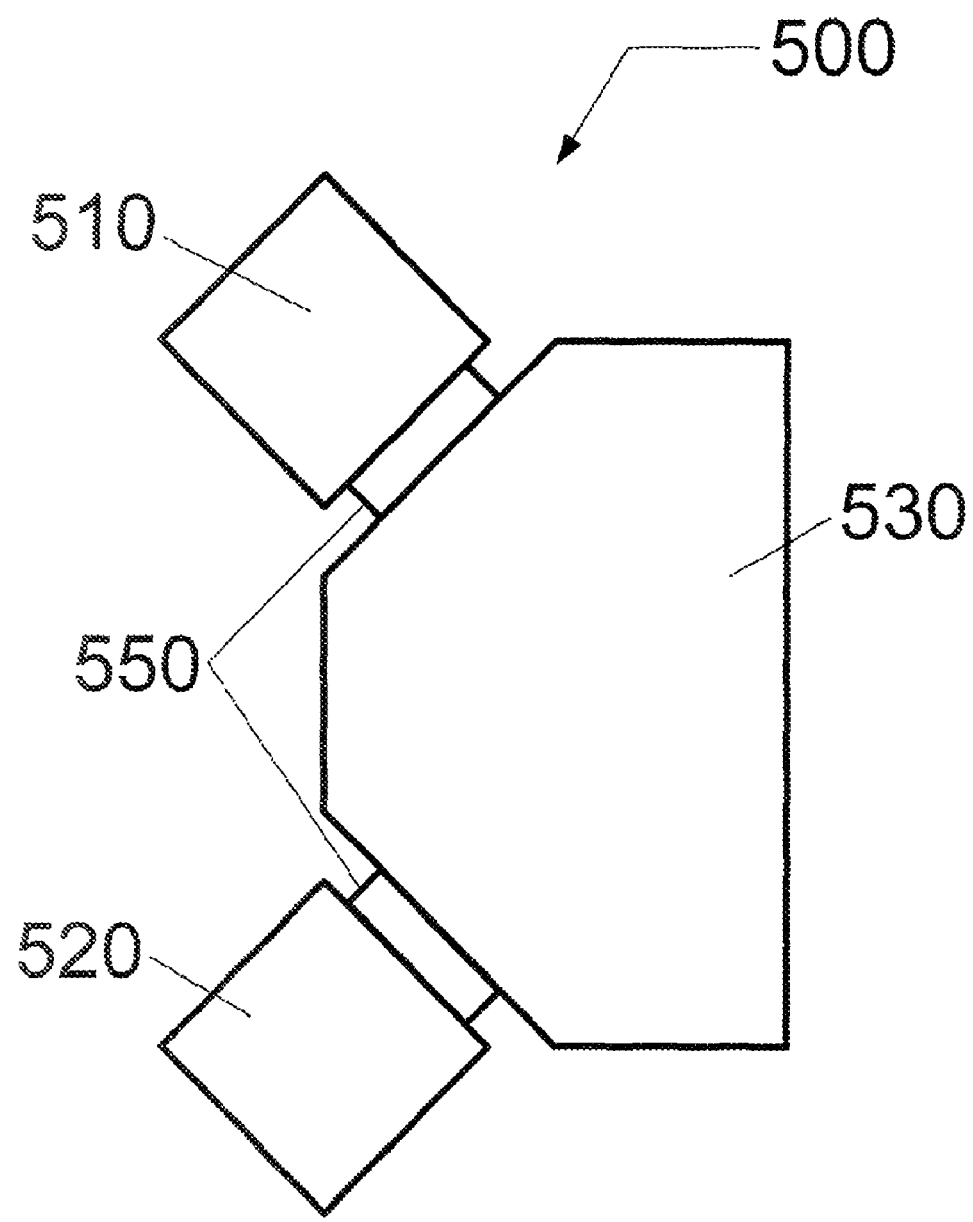

Alternately, in another embodiment, FIG. 4B presents a processing system 500 for performing a dry, non-plasma cleaning process on a substrate. The processing system 500 comprises a first treatment system 510, and a second treatment system 520. For example, the first treatment system 510 can comprise a chemical treatment system, and the second treatment system 520 can comprise a thermal treatment system.

Also, as illustrated in FIG. 4B, a transfer system 530 can be coupled to the first treatment system 510 in order to transfer substrates into and out of the first treatment system 510, and can be coupled to the second treatment system 520 in order to transfer substrates into and out of the second treatment system 520. Additionally, transfer system 530 can exchange substrates with one or more substrate cassettes (not shown). Although only two process systems are illustrated in FIG. 4B, other process systems can access transfer system 530 including such devices as etch systems, deposition systems, coating systems, patterning systems, metrology systems, etc. In order to isolate the processes occurring in the first and second systems, an isolation assembly 550 can be utilized to couple each system. For instance, the isolation assembly 550 can comprise at least one of a thermal insulation assembly to provide thermal isolation, and a gate valve assembly to provide vacuum isolation. Additionally, for example, the transfer system 530 can serve as part of the isolation assembly 550.

Figure 4C:
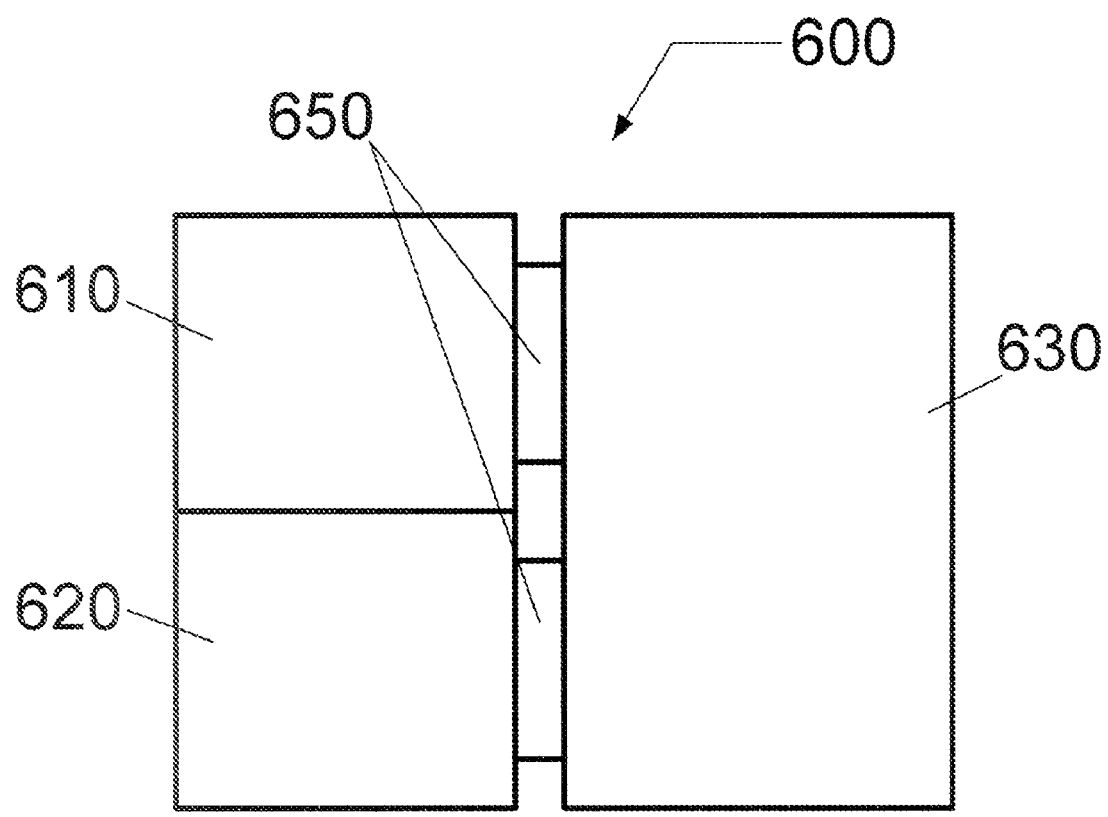

Alternately, in another embodiment, FIG. 4C presents a processing system 600 for performing a dry, non-plasma cleaning process on a substrate. The processing system 600 comprises a first treatment system 610, and a second treatment system 620, wherein the first treatment system 610 is stacked atop the second treatment system 620 in a vertical direction as shown. For example, the first treatment system 610 can comprise a chemical treatment system, and the second treatment system 620 can comprise a thermal treatment system.

Also, as illustrated in FIG. 4C, a transfer system 630 can be coupled to the first treatment system 610 in order to transfer substrates into and out of the first treatment system 610, and can be coupled to the second treatment system 620 in order to transfer substrates into and out of the second treatment system 620. Additionally, transfer system 630 can exchange substrates with one or more substrate cassettes (not shown). Although only two process systems are illustrated in FIG. 4C, other process systems can access transfer system 630 including such devices as etch systems, deposition systems, coating systems, patterning systems, metrology systems, etc. In order to isolate the processes occurring in the first and second systems, an isolation assembly 650 can be utilized to couple each system. For instance, the isolation assembly 650 can comprise at least one of a thermal insulation assembly to provide thermal isolation, and a gate valve assembly to provide vacuum isolation. Additionally, for example, the transfer system 630 can serve as part of the isolation assembly 650.

As illustrated above, the chemical treatment system and the thermal treatment system may comprise separate process chambers coupled to one another. Alternatively, the chemical treatment system and the thermal treatment system may be a component of a single process chamber.

Figure 5:
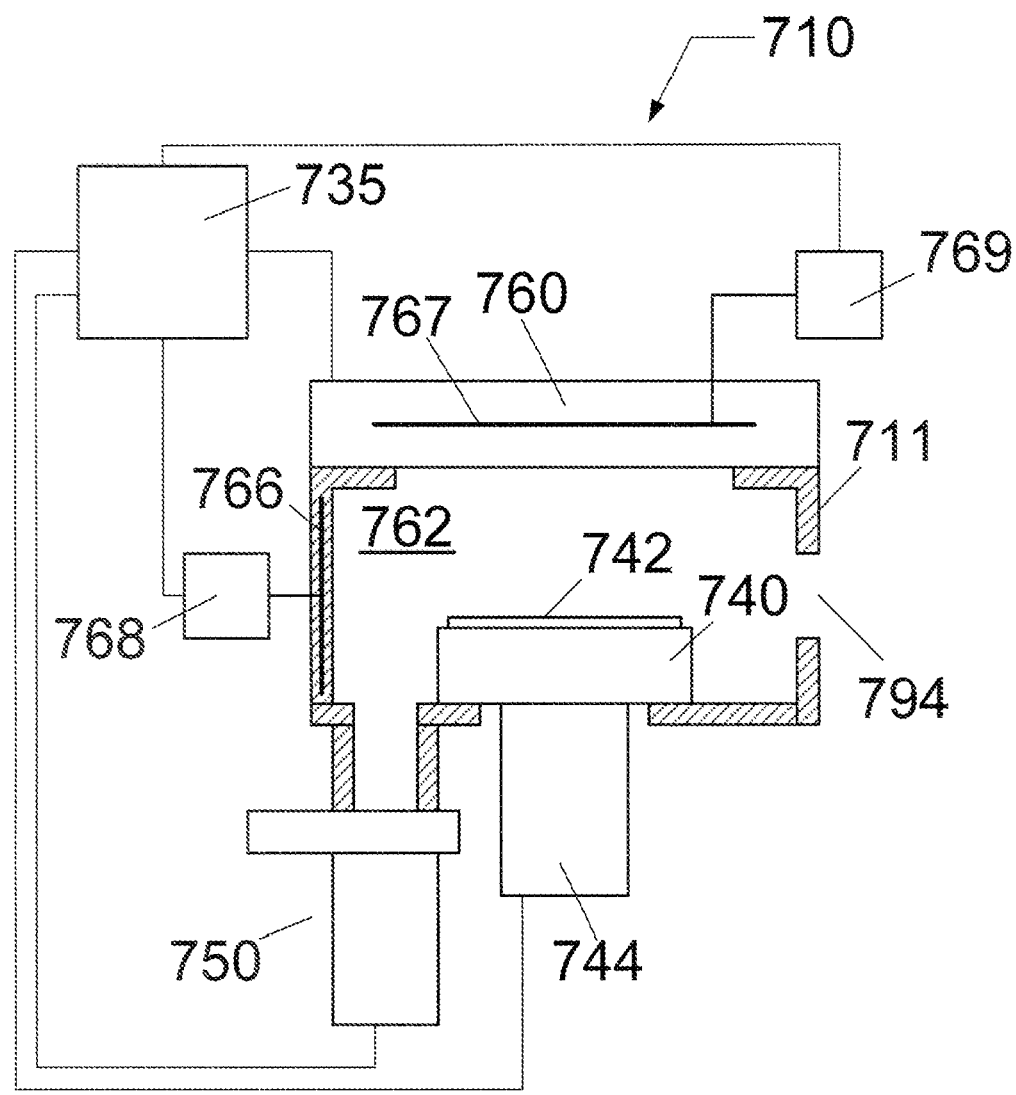
FIG. 5 presents a chemical treatment system according to another embodiment.

Referring now to FIG. 5, a chemical treatment system 710 comprises a temperature controlled substrate holder 740 configured to be substantially thermally isolated from the chemical treatment chamber 711 and configured to support a substrate 742, a vacuum pumping system 750 coupled to the chemical treatment chamber 711 to evacuate the chemical treatment chamber 711, and a gas distribution system 760 for introducing a process gas into a process space 762 within the chemical treatment chamber 711. Substrate 742 can be transferred into and out of chemical treatment chamber 711 through transfer opening 794.

Additionally, the chemical treatment system 710 comprises a chamber temperature control element 766 coupled to a chamber temperature control system 768. The chamber temperature control element 766 can include a heating unit, or a cooling unit, or both. Furthermore, the chemical treatment system 710 comprises a gas distribution temperature control element 767 coupled to a gas distribution temperature control system 769. The gas distribution temperature control element 767 can include a heating unit, or a cooling unit, or both.

Substrate holder 740 can cooperate with substrate holder assembly 744 to provide several operational functions for thermally controlling and processing substrate 742. For example, the substrate holder 740 and substrate holder assembly 744 may or may not comprise a substrate clamping system (i.e., electrical or mechanical clamping system), a heating system, a cooling system, a substrate backside gas supply system for improved thermal conductance between the substrate 742 and the substrate holder 740, etc.

Referring still to FIG. 5, a controller 735 may be coupled to the substrate holder assembly 744, the gas distribution system 760, the vacuum pumping system 750, the chamber temperature control system 768, and the gas distribution temperature control system 769. The controller 735 can include a microprocessor, memory, and a digital I/O port capable of generating control voltages sufficient to communicate and activate inputs to chemical treatment system 710 as well as monitor outputs from chemical treatment system 710.

Further details regarding the chemical treatment system 710 are described in U.S. Pat. No. 6,951,821 A1, entitled "Processing system and method for chemically treating a substrate"; the entire contents of which are incorporated herein by reference in their entirety.

Figure 6:
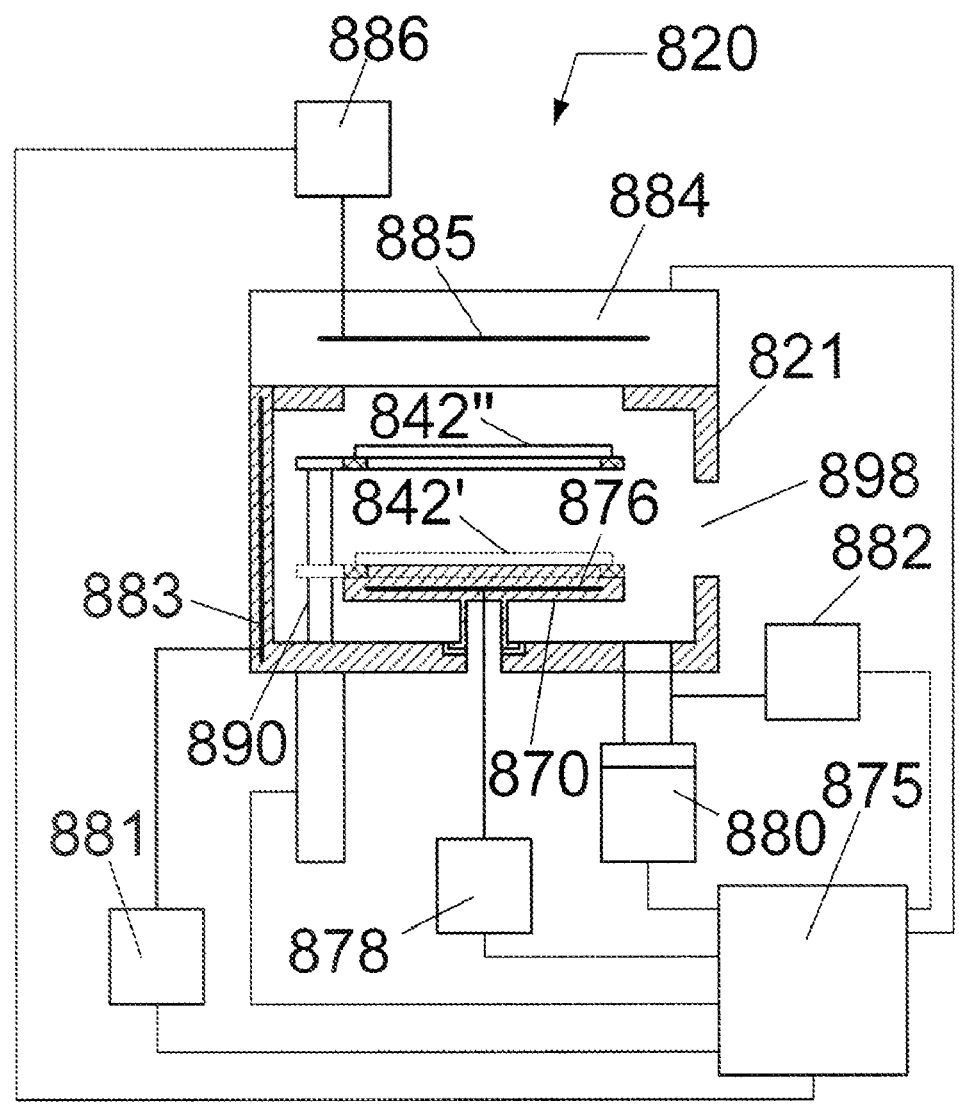
FIG. 6 presents a thermal treatment system according to another embodiment.

As illustrated in FIG. 6, a thermal treatment system 820 comprises a temperature controlled substrate holder 870 mounted within the thermal treatment chamber 821 and configured to be substantially thermally insulated from the thermal treatment chamber 821 and configured to support a substrate 842', a vacuum pumping system 880 to evacuate the thermal treatment chamber 821, and a substrate lifter assembly 890 coupled to the thermal treatment chamber 821. Lifter assembly 890 can vertically translate the substrate 842" between a holding plane (solid lines) and the substrate holder 870 (dashed lines), or a transfer plane located therebetween. The thermal treatment chamber 821 can further comprise an upper assembly 884 that may be configured to introduce a process gas, such as a purge gas, during thermal treatment of substrate 842'. Substrate 842' (or 842") can be transferred into and out of thermal treatment chamber 821 through transfer opening 898.

Additionally, the thermal treatment system 820 comprises a chamber temperature control element 883 coupled to a chamber temperature control system 881. The chamber temperature control element 883 can include a heating unit, or a cooling unit, or both. Furthermore, the thermal treatment system 820 comprises an upper assembly temperature control element 885 coupled to an upper assembly temperature control system 886. The upper assembly temperature control element 885 can include a heating unit, or a cooling unit, or both.

As illustrated in FIG. 6, the thermal treatment system 820 comprises substrate holder 870 having a substrate holder temperature control element 876 and a substrate holder temperature control system 878. The substrate holder temperature control element 876 can include a heating element, such as a resistive heating element. Furthermore, for example, the substrate holder 870 may or may not comprise a substrate clamping system (i.e., electrical or mechanical clamping system), an additional heating system, a cooling system, a substrate backside gas supply system for improved thermal conductance between the substrate 842' and the substrate holder 870, etc.

Furthermore the thermal treatment system 820 comprises an exhaust monitoring system 822 coupled to the duct upstream of the vacuum pumping system 880. The exhaust monitoring system 882 is configured to measure an amount of impurities present in the effluent of thermal treatment chamber 821.

Referring still to FIG. 6, a controller 875 may be coupled to the upper assembly 884, the vacuum pumping system 880, the chamber temperature control system 881, the upper assembly temperate control system 886, the substrate holder temperature control system 878, the substrate lifter assembly 890, and the exhaust monitoring system 882. The controller 875 can include a microprocessor, memory, and a digital I/O port capable of generating control voltages sufficient to communicate and activate inputs to thermal treatment system 820 as well as monitor outputs from thermal treatment system 820.

Further details regarding the thermal treatment system 820 are described in pending U.S. patent application Ser. No. 10/704,969, entitled "Processing system and method for thermally treating a substrate"; the entire contents are incorporated herein by reference in their entirety.

Internal surfaces of the chemical treatment system 710 may have a coating. Additionally, internal surfaces of the thermal treatment system 820 may have a coating. The coating may include Teflon®.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A method of monitoring an amount of contamination on a substrate, comprising:
disposing a substrate having contamination in a cleaning system configured to remove said contamination using a dry, non-plasma cleaning process, wherein said contamination has accumulated as a result of a series of processing steps in a manufacturing process flow, and said contamination comprises a metal-containing contamination;
performing said dry, non-plasma cleaning process by:
chemically treating said contamination within said cleaning system in order to chemically alter said contamination, wherein said chemically treating said contamination comprises exposing said contamination to a process gas having as incipient ingredient HF, and
thermally treating said chemically altered contamination in order to evaporate said chemically altered contamination; and
during said dry, non-plasma cleaning process, monitoring the exhaust of gaseous effluent from said thermal treatment of said substrate to determine an amount of said contamination on said substrate.

2. The method of claim 1, wherein said contamination comprises a metal oxide contamination or metal nitride contamination or combination thereof.

3. The method of claim 1, wherein said chemically treating said substrate comprises exposing said substrate to a process gas further having as incipient ingredients and optionally ammonia ($NH_3$).

4. The method of claim 3, wherein said exposing is performed at a process pressure ranging from approximately 1 mtorr to approximately 100 torr.

5. The method of claim 3, wherein said exposing is performed while said substrate is at a temperature ranging from approximately 10 degrees C. to approximately 200 degrees C.

6. The method of claim 3, wherein said exposing comprises exposing said substrate to a process gas further comprising an inert gas.

7. The method of claim 6, wherein said exposing comprises exposing said substrate to a process gas further comprising a noble gas.

8. The method of claim 1, wherein said thermally treating comprises elevating a temperature of said substrate to above approximately 50 degrees C.

9. The method of claim 1, wherein said thermally treating comprises elevating a temperature of said substrate to above approximately 100 degrees C.

10. The method of claim 9, wherein said thermally treating is performed during introducing an inert gas.

11. The method of claim 10, wherein said introducing further comprises introducing nitrogen.

12. The method of claim 1, wherein said monitoring the exhaust of gaseous effluent from said thermal treatment comprises sampling a portion of the gaseous effluent with a mass spectrometry system.

13. The method of claim 12, wherein said mass spectrometry system comprises an inductively coupled plasma mass spectrometer (ICP-MS).

14. A method of monitoring a manufacturing process, comprising:
introducing a production substrate to a manufacturing process flow in order to initiate fabrication of an electronic device on said production substrate;
during said manufacturing process flow, performing a dry, non-plasma cleaning process on said substrate in order to remove contamination accumulated on said production substrate as a result of a series of processing steps in a manufacturing process flow, said contamination comprises a metal-containing contamination; and
monitoring the exhaust of effluent from said dry, non-plasma cleaning process in order to determine an amount of contamination on said production substrate wherein said performing said dry, non-plasma cleaning process on said substrate comprises:
chemically treating said contamination in order to chemically alter said contamination, wherein said chemically treating said contamination comprises exposing said contamination to a process gas having as incipient ingredient HF; and thermally treating said chemically altered contamination in order to evaporate said chemically altered contamination.

15. The method of claim 14, wherein said chemically treating said contamination and said thermally treating said chemically altered contamination are performed within the same process chamber.

16. The method of claim 14, wherein said chemically treating said contamination and said thermally treating said chemically altered contamination are performed within separate process chambers.

* * * * *